March 28, 1961 F. STERZER 2,977,482

MICROWAVE AMPLIFIER

Filed Dec. 24, 1958 2 Sheets-Sheet 1

INVENTOR.
FRED STERZER
BY Milton S. Winters
ATTORNEY

INVENTOR.
FRED STERZER
BY
Milton S. Winters
ATTORNEY

United States Patent Office 2,977,482

Patented Mar. 28, 1961

2,977,482

MICROWAVE AMPLIFIER

Fred Sterzer, Monmouth Junction, N.J., assignor to Radio Corporation of America, a corporation of Delaware Filed Dec. 24, 1958, Ser. No. 782,939

11 Claims. (Cl. 307—88)

This invention relates generally to improved microwave pulse amplifiers, and particularly to an improved microwave pulse amplifier utilizing a parametric oscillator.

Very fast digital computing circuits can be built using microwave techniques. In one form of coding used in such circuits, a binary "one" may be represented by a pulse of radio frequency energy in a given time space and a binary "zero" by the absence of such a pulse in the time space. This system of coding is identified herein as "pulse amplitude script." In digital computers, these pulses may be required to pass through a great many transmission devices before they have completely served their purpose. In the course of successive transmissions, a pulse may become appreciably deteriorated. That is to say, its amplitude may have been attenuated and its rise and fall time increased to the point where the pulse is no longer usable. The pulses must therefore be amplified and reshaped periodically.

In a microwave computer system, the required amplification may be accomplished by use of traveling wave tube amplifiers. However, it is desirable to have different means for providing the desired amplification.

It is an object of the present invention to provide a novel and improved microwave amplifier.

Another object of the present invention is to provide a novel and improved microwave amplifier especially adapted to amplify radio-frequency pulse type signals.

Yet another object is to provide a novel and improved microwave pulse amplifier which retimes and reshapes the pulses.

Still another object is to provide a novel and improved microwave amplifier having low power requirements.

The present invention provides a novel method and means for amplifying and reshaping microwave radio-frequency pulse signals utilizing a parametric oscillator therefor. The signal, whether a pulse is present in a time space or not, is first converted into a continuous-wave radio-frequency signal. In the presence of a pulse in the time space, a continuous-wave signal of one amplitude and phase is obtained. In the absence of a pulse in the time space, a continuous-wave signal of the same amplitude but differing in phase by 180° is obtained. This continuous-wave signal of one phase or the other is applied to a parametric oscillator as an input signal and locks the oscillator in phase with it. Only a very small input signal is required for locking purposes. At the same time, or a little before, the new continuous-wave signal for each time space is applied, an external switching signal is applied to the oscillator circuit to interrupt the oscillations. When the external switching signal is removed, oscillations are again initiated and locked in the same phase as that of the input signal. The output signal from the oscillator, which now comprises a signal of the same frequency and phase as the locking signal but of much greater amplitude, may be reconverted to pulse form of the pulse amplitude script.

Figures 1, 4:
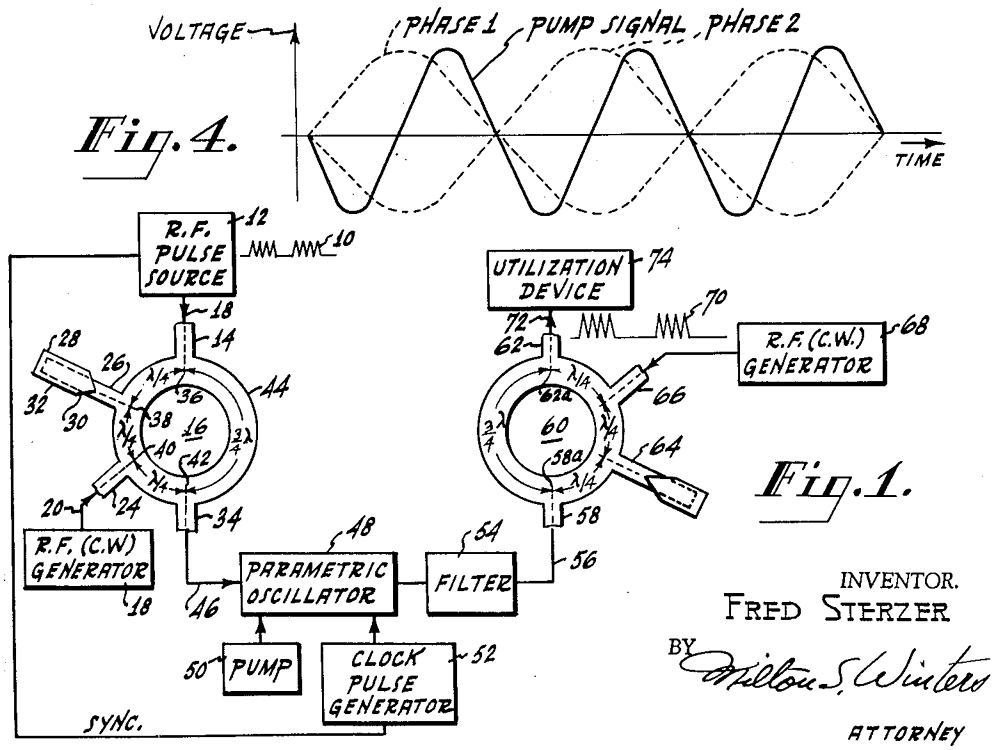
Figure 1 is a view, partly in block form and partly in plan, of an amplifier circuit in accordance with the present invention.
Figure 4 is a set of curves illustrating the phase relationships of the two possible outputs of a parametric oscillator to that of the pump signal when practicing the present invention.

A microwave pulse amplifier circuit employing a parametric oscillator in accordance with the present invention is illustrated in Figure 1. A portion of this circuit is shown in schematic form. A radio-frequency pulse type signal such as is illustrated at 10 is applied from a pulse source 12 to one arm 14 of a hybrid junction 16 by a transmission line 18. The hybrid junction or hybrid circuit is a generic term which also includes devices such as a "magic-T," or a "rat-race." The pulse source 12 represents a source of digital signals, which may be a microwave computer, and may be the output of a logic circuit in the computer, for example. The signal 10 comprises a series of radio-frequency pulses. For purposes of explanation, assume that the frequency is $f_0$.

The output of a second continuous-wave, radio-frequency generator 18 is transmitted by a transmission line 20 to a second arm 24 of the hybrid junction 16. The generator 18 also supplies a radio-frequency signal of frequency $f_0$, but it is adjusted to provide a signal equal to one-half the power of the pulse input signal 10. In practice, the generator 18 and the pulse source 12 may derive their radio-frequency energy from a common source. A third arm 26 of the hybrid junction 16 is terminated in a matched absorptive termination 28, such as is known in the art, and which may be a thin flat piece of dielectric material such as graphite. The termination 28 may have a tapered portion 30 which is laid over the end of the arm 26 and a rectangular portion 32 into which the tapered portion 30 merges. An output signal from the hybrid junction 16 is obtained from its fourth arm 34. The arms 14, 24, 26, and 34 have, respectively, junctions 34, 40, 38, and 42 located within a circular path which is 3λ/4 in mean circumference, where λ is one wave length in the hybrid ring at the frequency $f_0$. Electrically, the junctions 36, 38, 40 and 42 are spaced one-quarter of a wavelength apart at the frequency $f_0$, and the junctions 36 and 42 are spaced three-quarters of a wavelength apart at the same frequency.

The fourth or output arm 34 of the hybrid junction 16 is connected by a transmission line 46 to a phase locked oscillator 48 and applies an input or locking signal thereto. Phase locked oscillators are well known in the art, and an embodiment of a type suitable for use in practicing the present invention is described hereinafter. The phase locked oscillator and its associated signal sources are shown in block form in this figure.

A pump 50 is connected with the phase locked oscillator 48 to supply energizing power thereto at a frequency equal to twice that of the oscillating frequency or $2f_0$. Voltage pulses from a pulse source 52, which may be a clock pulse generator in a digital computer, for example, are periodically applied to the phase locked oscillator 48 to interrupt oscillations. An amplified output signal derived from the phase locked oscillator 48 is fed to a filter 54 to eliminate pump frequency signal components from the output. The filter 54 is connected by a transmission line 56 to an input arm 58 of a second hybrid junction 60 to supply an input signal thereto.

The hybrid junction 60 comprises, besides the input arm 58, an output arm 62, a terminated arm 64, and an arm 66 to which a continuous-wave radio-frequency signal generator 68 is connected. Associated with the arms 58 and 62 are junctions **58*a* and 62*a*. The generator 68 is arranged to supply a signal to the arm 66 of the same amplitude as the input signal to the arm 58 and of the same phase as the output signal from the generator 18. Such an arrangement can be easily achieved, for example, by providing a common radio-frequency signal generator for both the hybrid junctions 16 and 60 with adjustably phased inputs for at least one, and supplying the signals thereto through an adjustable attenuator. An amplified pulse type output signal such as illustrated at 70 is obtained from the output arm 62 of the hybrid junction 60. The amplified output signal 70 is fed by a transmission line 72 from the output arm 62 to a utilization device 74**.

Since the radio-frequency generators 18 and 68 are required to supply signals of the same phase, which phase bears a definite relationship to the output of the pump 50, a convenient and simple way of achieving this is to use an additional pair of parametric oscillators, or even a single parametric oscillator, as the radio-frequency generators, and to energize the parametric oscillator or oscillators by the pump 50.

In operation of the circuit shown in Figure 1, assume that the pulse source 12 supplies a radio-frequency pulse, or a binary "one," of one amplitude and phase to the arm 14 of the hybrid junction 16. This pulse of radio-frequency energy travels around the hybrid junction 16 to the output arm 34. At the same time the continuous-wave, radio-frequency generator 18 is adjusted to supply a signal to the arm 24 such that at the junction 40 this signal is of the same phase as a binary "one" input signal at the junction 36, and of one-half the power amplitude. The amplitude and phase may be adjusted by suitable means located within the radio-frequency generator 18. The junction 42 of the output arm 34 is spaced electrically three-quarters of a wavelength from the junction 36 of the input arm 14, and one-quarter of a wavelength from the junction 40 of the arm 24. Thus, the pulse signal 10 travels one-half wavelength further than the continuous-wave signal from the radio-frequency generator 18 to reach the junction 42, resulting in a phase difference of 180° between the two signals at this junction. The two signals are therefore out of phase at the junction 42 and an output signal appears here equal to one-half the power amplitude of the input pulse.

In the case of a binary "zero," an input pulse is not applied to the input arm 14, and only the signal from the continuous-wave, radio-frequency generator 18 appears at the output junction 42. This signal is shifted one-quarter wavelength in phase by the time it reaches this junction. The signal from the output arm 34 in this case is then equal in amplitude to the signal output in the presence of an input pulse, but separated therefrom in phase by 180°.

The input circuit utilizing the hybrid junction 16 therefore transforms "pulse amplitude script," wherein in a binary "one" is represented by a pulse of radio-frequency energy in a given time space and a binary "zero" by the absence of such a pulse, into "phase script" wherein a binary "one" is represented by a radio-frequency signal if one amplitude and phase with respect to a reference signal and a binary "zero" by a radio frequency signal of the same amplitude but differing in phase by 180° from the reference signal.

The "phase script" is fed as an input, or locking signal, by the transmission line 46 to the parametric oscillator 48. An embodiment of a parametric oscillator suitable for use in the invention is described hereinafter. The pump 50 supplies driving power for the phase locked oscillator 48 at a frequency $2f_0$, and the clock pulse generator 52 periodically causes oscillations to cease to permit the parametric oscillator to change phase in step with the phase changes of the input signal, as discussed heretofore. The clock pulse generator 30 must be synchronized with the input signal 10, and must interrupt oscillations during each pulse or binary digit interval. The synchronization is indicated by a line connecting the pulse source 12 with the clock pulse generator. The clock pulses may be generated by a stable oscillator circuit in the computer, such as a master timing oscillator, for example. By using the master timing oscillator to provide the clock pulses, then both signal amplification and pulse retiming are simultaneously achieved.

In brief, a parametric oscillator consists essentially of a resonant tank circuit comprising an inductance and a capacitance tuned to a resonant frequency, say $f_0$. Either the inductance or the capacitance is made to vary with frequency by an energizing source or a pump, which comprises a radio-frequency signal source operating at a frequency, say $2f_0$. Under these conditions, an effective negative resistance at the frequency $f_0$ appears in the tank circuit, so that it starts to oscillate parametrically at this frequency. The parametric oscillations are locked in phase to the oscillations of the pump. The oscillations can occur in either one of two possible phases 180° apart. Once the circuit starts to oscillate in either one of these two phases, it continues to do so until forcibly stopped or changed. If the circuit is initially at rest, and the pump is suddenly applied, both phases have an equal chance of occurring. The one that actually occurs is determined by initial conditions in the tank circuit at the time oscillations are resumed. This would be random noise in the absence of any signal. However, the circuit can be steered into one or the other phase by applying to it a small signal at a frequency $f_0$ and of desired phase during the time when oscillations are just beginning. This input signal is referred to as the locking signal.

The input or locking signal from the transmission line 46 then determines the phase of oscillation of the parametric oscillations 48 when, in the absence of pulses from the clock pulse generator, the parametric oscillator resumes oscillation. Because only very small input or locking signal is required to control a large output signal, the circuit acts as an amplifier. Because the output signal from the parametric oscillator is independent of the input signal, degraded input signals are automatically reshaped.

It has been found that the output of the parametric oscillator 48 may be as much as 50 db above the power level of the input or locking signal, thus providing a power gain of 50 db.

As explained hereinbefore, the amplified signal from the parametric oscillator 48 is fed to a filter element 54 to remove pump frequency signal components therefrom, and the output signal from the filter 54 is then applied to the input arm 80 of the hybrid junction 60. In the hybrid junction 60, the "phase script" is reconverted to "pulse script."

A continuous wave radio-frequency signal is applied by the generator 68 to the arm 66 of the hybrid junction 60. The generator 68 is arranged to apply a signal to the junction **66*a*, equal in power to the input signal from the parametric oscillator 48, and of the same phase as the signal from the radio-frequency generator 18. As noted hereinbefore, the radio-frequency signal generators 18 and 68 may be common, or they may each be parametric oscillators energized by the pump 50**.

The input signal from the parametric oscillator 48 is shifted three-quarters of a wavelength, and the signal from the radio-frequency generator 68 is shifted by one-quarter wavelength at the time these signals reach the output junction **62*a*. If both signals start at the same phase at the junctions 66*a* and 58*a***, they will be 180° out of phase at the junction *62a*, and there will be no output from the hybrid junction 60. If the signal at the junction *58a* shifts in phase by 180°, then this signal and the signal from the generator 68 add at the output junction *62a* and provide an amplified pulse output signal. Thus the phase changes in the parametric oscillator 48 are converted to a pulse output signal. Such an output signal is illustrated at 70. This amplified pulse signal may be coupled by a transmission line 72 to a utilization device 74 which may be a logic circuit in a computer, for example.

Briefly, in the operation of the circuit of Figure 1, a pulse-type, radio-frequency signal 10 is first converted in the circuit including the hybrid junction 16 to a continuous-wave, radio-frequency signal of either of two phases 180° apart. The continuous-wave signal is then applied to the parametric oscillator 48 which can oscillate only in either of the same two phases. The continuous-wave signal locks the parametric oscillator 48 in phase with it. The output signal from the parametric oscillator is then applied to an output circuit which includes the hybrid junction 60, where the continuous-wave signal is reconverted to an amplified pulse signal 70.

Figure 2:
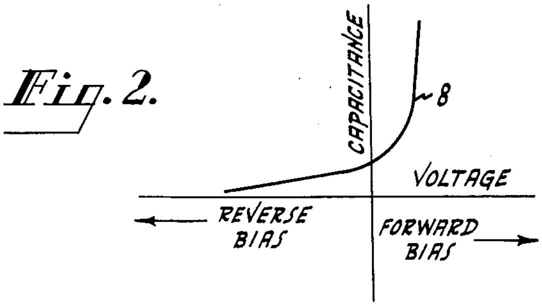
Figure 2 is a graph illustrating the relationship of capacitance to applied voltage for one type of voltage-sensitive, variable capacitance diodes.

The capacitance versus voltage characteristic of one type of semiconductor diode is illustrated in Figure 2. A non-linear characteristic of this type is well suited for use in parametric oscillators.

Figure 3:
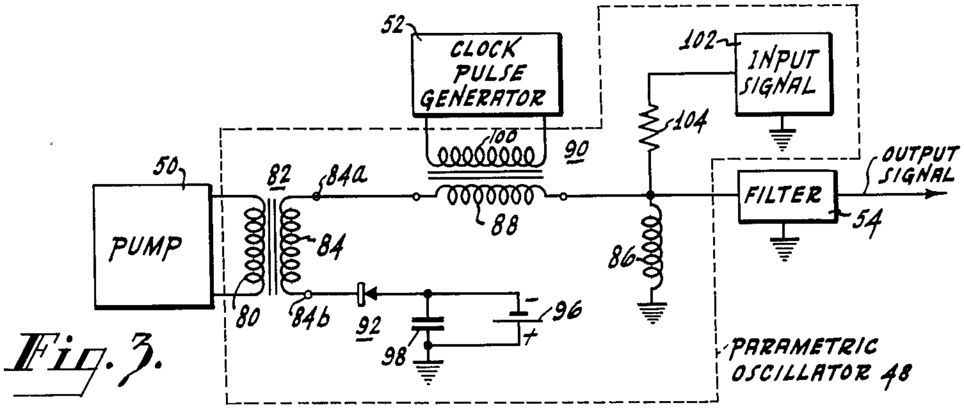
Figure 3 is a circuit diagram which illustrates a lumped constant parametric oscillator.

One form of parametric oscillator that may be used to practice the invention and utilizing a variable capacitance semiconductor diode is shown in Figure 3. The components are of the so-called lumped constant type as distinguished from the distributed constant type. In this circuit, an A.C. signal source or pump 50 is connected across a primary winding 80 of a signal input transformer 82 having a secondary winding 84, to supply driving power for the oscillator. The A.C. signal source may be, for example, a klystron, magnetron, or triode oscillator. The secondary winding 84 is connected in the parametric oscillator circuit. An inductor 86 and a secondary winding 88 of a pulse input transformer 90 are serially connected between one end terminal *84a* of the input transformer secondary winding 84 and a point of reference potential, illustrated as circuit ground. The cathode of a variable reactance diode 92 is connected to another end terminal *84b* of the input transformer secondary winding 84 and the anode thereof is connected to the negative terminal of a D.C. (direct current) source, such as battery 96. The positive terminal of the battery 96 is connected to the ground. Thus the diode is reverse biased to be normally nonconducting. The battery 96 is preferably of such value that the diode is not driven into conduction by action of the A.C. signals from the pump 50. A capacitor 98 may be connected across the battery 96 to by-pass high frequency signals therefrom. The combination of the inductor 86 and the variable capacitance diode 92 form a resonant tank circuit. For purposes of the present invention, it has been found that the oscillator performs best when the parameters are adjusted so that the "natural" resonant frequency of the tank circuit lies close to one-half the frequency of the A.C. signals from the pump 50.

Voltage pulses from a pulse source 52, which may be the clock pulse generator discussed hereinbefore are applied to the oscillator circuit to interrupt the oscillations. These pulses are preferably of such amplitude and polarity that each pulse drives the diode 92 into conduction, thereby causing the oscillations to rapidly die out. A more detailed explanation of this action may be found in the copending application of Walter R. Beam and Fred Sterzer, Serial No. 770,822, filed October 30, 1958, for "Parametric Oscillator Circuits," and assigned to the assignee of this invention. The output from the clock pulse generator 52 is applied across a primary winding 100 of the pulse input transformer 90.

When the clock pulse generator permits the oscillator to once again sustain oscillations, the instantaneous phase of oscillation is determined by the conditions existing in the tank circuit as oscillations are resumed. Therefore, the input or locking signal from an input signal generator 102 is applied to the parametric oscillator circuit through a resistor 104 connected to the ungrounded end of the inductor 86.

The output from the oscillator circuit may be taken from across the inductor 86. Inasmuch as components of the pump signal may be present in the oscillator output, it is desirable to include in the output circuit the filter 54 which blocks signals at the pump frequency and which passes signals at the oscillator frequency.

In operation of the circuit of Figure 3, application of pump signals to the parametric oscillator 48 causes the circuit to begin oscillating parametrically at a multiple of the pump frequency and in either one or the other of two opposite phases. When variable capacity diodes are used, the second subharmonic of the pump frequency is used, as has been noted heretofore, because the energy storage between the supply and the output circuits is most efficient at this frequency.

When it is desired to change the phase of oscillations of the circuit 48, the clock pulse generator 52 applies a voltage pulse to the diode 92 to forward bias it, thus causing oscillations to stop. An input signal, at the subharmonic frequency and of desired phase is coupled to the circuit 48. At the termination of the clock pulse, the input signal steers the circuit 48 into the desired phase of oscillation.

Figure 4 illustrates graphically by voltage vs. time curves the two possible output phases that may be obtained from the parametric oscillator such as that of Figure 3 when it is oscillating at the second subharmonic or one-half the pump frequency. The output from the parametric oscillator will be either in phase or 180° out of phase with this reference signal. The outputs are shown by the dashed lines marked phase 1 and phase 2 while the pump signal is shown by the solid line.

Figure 5:
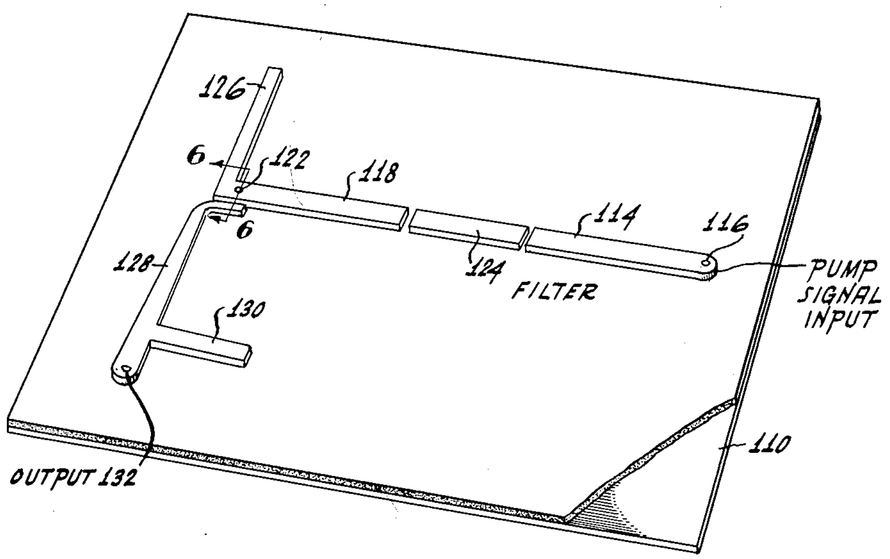
Figure 5 is a perspective view of one form of parametric oscillator constructed of strip-line components and capable of very high frequency operation which may be used in practicing the present invention.

Figure 5 illustrates, in perspective, a preferred parametric oscillator suitable for use in a microwave amplifier of the type heretofore described. The components are of so called strip-line construction. Such strip lines may be constructed by employing a metal ground plate 110, which may be copper, applied as a backing on one surface of a suitable dielectric material 112. On the other surface of the dielectric 112 are strips of copper which may be established by printed circuit etching or plating techniques to form the desired circuit. A transmission line is formed between such a strip of copper and the spaced ground plate 110. The input from the pump may be coupled to a section 114 of strip line at a point 116 from another transmission line (not shown), such as a coaxial line, by means of a known type of transducer. A suitable transducer for this purpose is described in the copending application of Donald J. Blattner and Fred Sterzer, Serial No. 760,225, filed September 10, 1958, for "Logic Circuits," and assigned to the assignee of the present invention. As described in this copending application, these transducers preferably include an outer conductor connected to the ground plate and an inner conductor which passes through an aperture in the ground plate to make connection with the strip line as at the point 116.

The parametric oscillator circuit comprises a section 118 of strip line and a voltage-sensitive, variable-capacitance diode 120 mounted at 122, in the manner illustrated in Figure 5. The diode 120 and its associated section 118 of strip line form a tank circuit. Although the parameters may be adjusted so that parametric oscillations will be sustained at any of the permissible frequencies, we prefer to operate the circuit at one-half the pump frequency. A section 124 of strip line is inserted between the oscillator section 118 and the section 114 to which the pump signal is coupled. The section 124 is preferably one-half wavelength at the pump frequency and serves as a filter which passes the pump signal to the oscillator and prevents signals at the oscillator frequency from being fed back to the pump. A D.C. return for the parametric oscillator diode to ground is provided by a section 126 of strip line which is approximately one-quarter wavelength at the oscillator frequency, and has its end remote from the diode 120 short-circuited to the ground plate 110.

The coupling for the output is in the form of the a tapered section 128 of strip line which tapers down to a very small fraction of the normal width of the strip conductor and approaches within perhaps 0.02 inch of the diode end of the section 118. The tapering affords impedance matching. Coupling may be decreased by shaving off part of the end of the coupling section 128, or increased by connecting a wire on the surface of the coupling section 128 to approach nearer the diode resonator. A filter is provided to remove components of the pump signal from the output. Such a filter may be an open-circuited stub 130, which is one-quarter wavelength at the pump frequency and grounded at its outer end. A suitable transducer may be connected, for example, at the point 132, if it is desired to transmit the output over a coaxial transmission line. Such a transducer may be of the type described in the aforementioned copending application.

Figure 6:
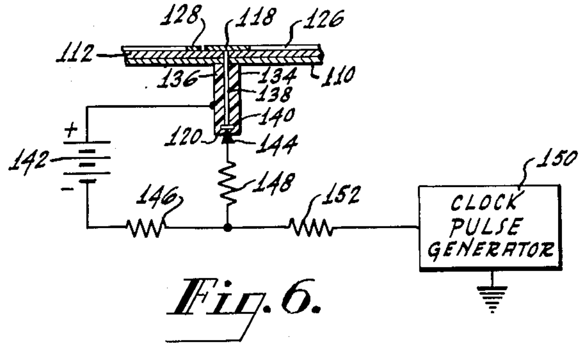
Figure 6 is a cross-sectional view of a detail of Figure 5 taken along the line 6—6 of Figure 5 and showing certain circuit components connected thereto.

Figure 6 illustrates the manner in which the diode 120 may be inserted into the circuit. A transducer 134 includes an outer conductor 136 connected to the ground plate 110, and an inner conductor 138 which passes through an aperture in the ground plate to make connection to the section 118 of strip line. Suitable impedance matching may be provided. The transducer 134 may have a mounting at its termination for the variable capacitance diode 120. The cathode 140 of the diode is connected to the inner conductor 138. The diode is back-biased by a suitable biasing source, such as by a battery 142. The positive terminal of the battery is connected to the outer conductor 136 of the transducer 134. The negative terminal of the battery 142 is connected to the anode 144 of the diode through resistors 146, 148. The diode 120 and battery 142 may be reversed, if desired. A source 150 provides pulses for switching the phase of oscillations. The pulse source 150 is indicated schematically as being connected between the anode 144 and ground. These pulses may be applied from the pulse source 150 through a resistor 152 to the junction of resistors 146 and 148. The pulses may also be applied in series with the diode.

The parametric oscillator shown in Figure 5, constructed of strip-line components, is especially suited for use at microwave frequencies. It operates in the same manner as the parametric oscillator shown in schematic form in Figure 3, and discussed hereinbefore.

There has been described herein a novel microwave pulse amplifier circuit utilizing a parametric oscillator in which simultaneous pulse reshaping and retiming is also provided in a relatively simple circuit.

What is claimed is:

1. The combination with a source of radio-frequency pulses of one frequency in pulse amplitude script, of means for converting said pulses and the absence of any of said pulses into a radio-frequency signal respectively of one phase and a phase opposite said one phase at said one frequency, means for applying said radio-frequency signal to a parametric oscillator having two counter phases of oscillation at said one frequency, means for applying a pump signal to said oscillator to sustain oscillations thereof at said one frequency, means for intermittently applying to said parametric oscillator a further signal for causing the phase of said oscillations to change in accordance with the phase of said radio-frequency signal, and means for converting the output of said parametric oscillator to a pulse type radio-frequency signal in correspondence with said pulse signals.

2. The combination with a source of radio-frequency pulse signals in which the presence of a radio-frequency pulse signifies a binary digit "one" and the absence of a radio-frequency pulse signifies a binary digit "zero," of a system for amplifying said pulse signals comprising circuit means for converting said radio-frequency pulse signals and the absence thereof into a continuous-wave signal at the same frequency having respectively a predetermined phase and a phase opposite to said predetermined phase, means for coupling said continuous-wave signals to a parametric oscillator, means for applying a pump signal to said parametric oscillator, means for applying periodically a signal to said oscillator to interrupt the oscillations of said oscillator, whereby oscillations are restored in accordance with the phase of said continuous-wave signal, and output coupling means for converting the output of said oscillator to a radio-frequency pulse signal in correspondence with said pulse signals.

3. The combination with a source of radio-frequency pulse signals of a parametric oscillator having a number of distinct phases of oscillation at one frequency, means for applying pump signals to said oscillator to sustain oscillations therein at said one frequency, means for converting said radio-frequency pulse signals into a continuous-wave input signal having a like number of distinct phases, means for intermittently applying to said oscillator a further signal to cut off temporarily said oscillator, means for synchronizing the operation of said signal source and said means for applying a further signal, means for applying said continuous-wave input signal to said parametric oscillator to lock said oscillator in a phase corresponding to that of said continuous-wave input signal, whereby said oscillator output is a continuous-wave output signal corresponding in its phases respectively to said input signal pulses.

4. The combination set forth in claim 3 wherein said oscillator includes an element of variable reactance.

5. The combination set forth in claim 4, wherein said element of variable reactance comprises a semiconductor diode.

6. In a microwave pulse generator system, the combination comprising a source of radio-frequency pulse signals of one frequency in pulse amplitude script, the presence and absence of said pulses representing respectively, the two binary digits, means for converting said pulse signals into a continuous-wave radio-frequency signal at said one frequency wherein the two binary digits are represented respectively by two counter phases of oscillation at said one frequency, a parametric-oscillator circuit operating selectively in either one or the other of said two phases at said one frequency, means for applying said continuous-wave radio-frequency signal as a locking signal to said parametric oscillator, switching signal means connected with said parametric oscillator for momentarily interrupting the oscillations of said oscillator in synchronism with the operation of said pulse source, and means for converting the oscillations of said parametric oscillator into a radio-frequency pulse type signal at said one frequency in correspondence with the output of said pulse source.

7. The combination, with a source of radio-frequency pulse signals in pulse amplitude script, of means including a hybrid junction and a radio-frequency continuous-wave generator for converting said pulse signals into a continuous-wave radio-frequency signal having selectively one of two distinct phases, a parametric-oscillator circuit oscillating at the frequency of said continuous-wave signal and having two distinct phases corresponding to said two distinct phases of said continuous-wave radio-frequency signal, means causing said parametric oscillator to oscillate in phase with said continuous-wave radio-frequency signal, means for deriving an output signal from said oscillator, and means for converting said output signal to a radio-frequency pulse signal in pulse amplitude script which corresponds to the two phases of said parametric oscillator oscillations.

8. In a microwave pulse amplifier, the combination comprising a parametric oscillator having a number of distinct phases of oscillation at one frequency, means for applying A.C. signals to said parametric oscillator to cause said oscillator to oscillate parametrically at said one frequency, a source of radio-frequency pulse signals, means for converting said radio-frequency pulse signals into a continuous-wave input signal having a like number of distinct phases, means for applying to said parametric oscillator a further signal in synchronism with said pulse signal to periodically turn off said oscillator, means for applying said continuous-wave input signal to said parametric oscillator to lock said oscillator in a phase corresponding to that of said continuous-wave input signal, whereby said oscillator output is a continuous-wave output signal corresponding to said input signal, and means for converting said output signal to a radio-frequency pulse signal corresponding to the output of said pulse source.

9. In a microwave pulse amplifier, the combination comprising a parametric oscillator having a number of distinct phases of oscillation at one frequency, means for applying A.C. signals to said parametric oscillator to cause said oscillator to oscillate parametrically at said one frequency, a source of radio-frequency pulse signals, means including a first hybrid junction for converting said radio-frequency pulse signals into a continuous-wave input signal having a like number of distinct phases, means for applying to said parametric oscillator a further signal in synchronism with said pulse signal to periodically turn off said oscillator, means for applying said continuous-wave input signal to said parametric oscillator to lock said oscillator in a phase corresponding to that of said continuous-wave input signal, whereby said oscillator output signal corresponds to said input signal, and means including a second hybrid junction for converting said output signal to a radio-frequency pulse signal corresponding to the output of said pulse source.

10. In a microwave pulse amplifier, the combination comprising a source of radio-frequency pulse signals, an input hybrid junction having first, second, third and fourth junctions therein, said junctions being successively spaced one-quarter wavelength apart at the frequency of said radio-frequency pulse signals, said first and fourth junction in addition being spaced three-quarters of a wavelength apart at the frequency of said radio-frequency pulse signals, means for applying said radio-frequency pulse signals to said first junction, means for applying continuous-wave radio-frequency signals to said third junction, absorptive termination means connected with said second junction, means for deriving an output signal from said fourth junction, said output signal having a predetermined phase when a radio-frequency pulse is applied to said first junction and another predetermined phase when a radio-frequency pulse signal is not applied to said first junction, means for applying said output signal from said fourth junction to a parametric oscillator having a like number of predetermined phases and oscillating at the frequency of said radio-frequency pulses, means for periodically interrupting said parametric oscillator to cause it to lock in phase with said output signal, output signal means for said parametric oscillator, an output hybrid junction having a fifth, sixth, seventh, and eighth junction therein, said junctions being successively spaced one-quarter wavelength apart at said parametric oscillator frequency and said fifth and eighth junction being spaced three-quarters of a wavelength apart at said parametric oscillator frequency, means for applying said output signal from said parametric oscillator to said fifth junction, absorptive termination means connected with said sixth junction, means for applying continuous-wave radio-frequency signals to said seventh junction, and means for deriving an amplified radio-frequency pulse signal from said fifth junction.

11. The pulse amplifier system as set forth in claim 10 wherein said radio-frequency signal generators comprise parametric oscillators.

References Cited in the file of this patent

UNITED STATES PATENTS

| | | |
|---|---|---|
| 2,593,113 | Cutler | Apr. 15, 1952 |
| 2,749,521 | Engelmann et al. | June 5, 1956 |
| 2,815,488 | Von Neumann | Dec. 3, 1957 |
| 2,819,339 | Scoville | Jan. 7, 1958 |
| 2,847,517 | Small | Aug. 12, 1958 |

FOREIGN PATENTS

| | | |
|---|---|---|
| 778,883 | Great Britain | July 10, 1957 |